United States Patent [19]
Sato

[11] Patent Number: 4,611,236
[45] Date of Patent: Sep. 9, 1986

[54] MASTERSLICE SEMICONDUCTOR DEVICE

[75] Inventor: Shinji Sato, Atsugi, Japan

[73] Assignee: Fujitsu Limited, Kawasaki, Japan

[21] Appl. No.: 628,316

[22] Filed: Jul. 6, 1984

[30] Foreign Application Priority Data

Jul. 9, 1983 [JP] Japan .................. 58-125290

[51] Int. Cl.[4] .................. H01L 27/10; H01L 27/02
[52] U.S. Cl. .................. 357/45; 357/41; 357/42
[58] Field of Search .................. 357/41, 42, 45

[56] References Cited

U.S. PATENT DOCUMENTS

| | | | |
|---|---|---|---|
| 4,006,492 | 2/1977 | Eichelberger et al. | 357/45 |
| 4,161,662 | 7/1979 | Malcolm et al. | 357/45 |
| 4,255,672 | 3/1981 | Ohno et al. | 357/45 |
| 4,412,237 | 10/1983 | Matsumura et al. | 357/45 |

FOREIGN PATENT DOCUMENTS

| | | | |
|---|---|---|---|
| 2315804 | 4/1976 | France | 357/45 |
| 2365883 | 9/1977 | France | 357/45 |
| 57-148363 | 9/1982 | Japan | 357/45 |
| 58-51536 | 3/1983 | Japan | 357/45 |
| 58-122771 | 7/1983 | Japan | 357/45 |
| 59-11670 | 1/1984 | Japan | 357/45 |

OTHER PUBLICATIONS

Japanese Journal of Applied Physics, vol. 19, suppl. 19-1, 1980 pp. 203-206, Tokyo, JP, M. Ashida et al., "A 3000-Gate CMOS Masterslice LSI"; FIGS. 2-4; pp. 204, 205, paragraph 3: Structure of the LSI.

Primary Examiner—Andrew J. James
Assistant Examiner—Jerome Jackson, Jr.
Attorney, Agent, or Firm—Staas & Halsey

[57] ABSTRACT

A masterslice semiconductor device has two kinds of basic cells including a first one having the same size same as that of ordinary basic cells in a prior art masterslice semiconductor device and a second one having a size larger than that of the first basic cell. A number of the large-sized basic cells are arranged along columns of a semiconductor substrate and constitute a plurality of basic cell arrays which are disposed along rows of the semiconductor substrate. Each of the basic cell arrays of the second basic cells is situated between two adjacent basic cell arrays of the first basic cells. Each of the regions occupied by the basic arrays of the second basic cells can be used for distributing interconnecting lines as in the prior art masterslice semiconductor device. At least one of the second basic cells in each of the regions serves to interconnect the first basic cells in adjacent basic cell arrays, and also provides an elementary circuit block, that is a unit cell, in conjunction with the first basic cells.

17 Claims, 14 Drawing Figures

MASTERSLICE SEMICONDUCTOR DEVICE

BACKGROUND OF THE INVENTION

The present invention relates to a semiconductor device of a large scale integration (LSI) and, more specifically, relates to the improvement of a so-called masterslice semiconductor device fabricated from a large number of basic cells arranged along both rows and columns of a semiconductor substrate.

Masterslice semiconductor technology is proposed as a means for providing custom-tailored large scale integration (LSI) semiconductor circuits at a low cost and within a short turnaround time. That is, a large number of basic cells each including transistors and resistors, which are formed in a semiconductor chip in advance, are interconnected by the use of masks having wiring patterns necessary for realizing a functional circuit to meet each customer's specific requirements.

FIG. 1 is a plan view showing the conventional bulk pattern of a gate array formed by use of the masterslice technology. As illustrated in FIG.1, on a semiconductor substrate chip 100, the basic cells BC are arranged along the columns and constitute basic cell arrays $BL_1$, $BL_2$, ... $B_n$. Each of the basic cells BC is, in general, comprised of at least a pair of p-channel and n-channel MIS (Metal Insulator Semiconductor) transistors (to be simply referred to as p-channel and n-channel transistors, hereinafter).

The basic cell arrays are arranged with a specified space therebetween along the rows. At the periphery of the chip 100, there is a pad region, which is allotted for a plurality of pads, PD, used as the terminals to the external circuit, and an input/output (I/O) cell region, which is allotted for a plurality of I/O cells, IOC, each containing an input/output (I/O) circuit (not shown). As described later, each space between adjacent basic cell arrays is used for distributing the wiring lines interconnecting the basic cells in a basic cell array and/or the basic cells in different basic cell arrays.

FIG. 2 is an equivalent circuit diagram of an example of a conventional basic cell comprised of two pairs of p-channel and n-channel transistors. In FIG. 2, each pair of a p-channel transistor and an n-channel transistor, i.e. the first pair comprising a p-channel transistor $QP_1$ and an n-channel transistor $QN_1$, the second pair comprising a p-channel transistor $QP_2$ and an n-channel transistor $QN_2$, have a single common gate, and the p-channel transistors $QP_1$ and $QP_2$ have a single common source or drain, while the n-channel transistors $QN_1$ and $QN_2$ have a single common source or drain.

FIG. 3 is a plan view illustrating an exemplary bulk pattern of the basic cell embodying the circuit shown in FIG.2. The masterslice semiconductor device comprised of basic cells each having such a bulk pattern has been disclosed in U.S. Pat. No. 4,412,237 issued Oct. 25, 1983, for example.

In FIG. 3, like reference characters designate like or corresponding parts in FIG. 2, and further, reference numerals 1 and 2 designate a p-type region and an n-type region, respectively, both $3G_1$ and $3G_2$ represent polysilicon gate electrodes, and 4CP and 4CN denote a p-type contact region and an n-type contact region, respectively. The p-type region 1 is for constituting the sources and drains of the p-channel transistors $QP_1$ and $QP_2$, while the n-type region 2 is for constituting the sources and drains of the n-channel transistors $QN_1$ and $QN_2$. Each of the contact regions 4CP and 4CN provided with a relatively low resistivity is used as an electrode for keeping each portion of the semiconductor substrate at a respective potential.

In the masterslice semiconductor technology, an LSI circuit is comprised of a number of elementary circuits including a 2-input NAND gate, 2-input NOR gate and/or flip-flop circuit. Each of the elementary circuits is organized by using a single or a plurality of basic cells such as shown in FIGS. 2 and 3. The area occupied by the basic cells constituting each elementary circuit is referred to as a unit cell. In the prior art, each such unit cell is comprised of basic cells successively arranged in the same basic cell array. FIG. 4 is a conceptual diagram representing the prior art configuration of the unit cell UC (the hatched area) in a basic cell array BL. The basic cells in the unit cell UC are interconnected by use of a so-called double-layer aluminum metallization technology, wherein the aluminum wiring lines interconnecting the basic cells belonging to the unit cell are exclusively permitted to pass through, that is, over, the region occupied by the basic cells.

Interconnections among the unit cells are also accomplished by use of the double-layer aluminum metallization technology, however, the aluminum wiring lines for this purpose must be formed in the space between the adjacent basic cell arrays. This limitation is imposed by the performance of the CAD (Computer Aided Design) system employed for designing the layout of the circuit network of a masterslice semiconductor device.

These wiring lines formed in the space between adjacent basic arrays are assumed to be arranged on a virtual grid having a constant pitch. FIG. 5 is a plan view showing an exemplary layout of an aluminum wiring line interconnecting two adjacent basic cell arrays $BL_1$ and $BL_2$. In FIG.5, the wiring line consisting of the segments indicated by LA and LB are laid out on the virtual grid situated in the space between two adjacent basic arrays $BL_1$ and $B_2$. The virtual grid is, of course, not apparent in the actual pattern but only exists as a logical image in the process of CAD. If it is assumed that there are nine grid lines along the longitudinal direction of the basic cell arrays $BL_1$ and $BL_2$, nine wiring lines such as LA can be accommodated in the space. Such space is referred to as a wiring region of nine channels. The virtual grid lines in the transverse direction are similarly defined.

According to the double-layer aluminum metallization as described above, each segment LA extending along the longitudinal direction of the basic cell arrays is fabricated from the first wiring layer, while each segment LB extending perpendicularly to the longitudinal direction of the basic cell arrays is fabricated from the second wiring layer, each wiring layer is formed of aluminum, in general. The segments LA and LB are connected to other at each cross-over points marked with the doubled-circle NB, via a through-hole formed in the insulating layer therebetween. Thus, the interconnection between the basic cells in the two adjacent basic cell arrays is completed.

As mentioned before, in the prior art masterslice technology, the basic cells constituting a unit cell must be those belonging to the same basic cell array. That is, a unit cell must be one-dimensional in terms of the arrangement of the basic cells. This is mainly due to the performance of the present CAD systems employed for the network design of the masterslice semiconductor device. To manufacture a final masterslice semiconductor device within a required short turnaround time, it is necessary to minimize the design parameters which are defined in the CAD system. If a unit cell were defined to be two-dimensional in terms of the arrangement of the basic cells, the number of the parameters should be too large to finish the network design in a desired period. Therefore, each unit cell is formed in one basic cell array, and interconnections between adjacent basic cell arrays are conducted on a unit cell basis, and not on a basic cell basis.

As the result of the restriction that a unit cell must be one-dimensional in the sense mentioned above, both of the two kinds of the wiring lines, namely the first kind for interconnecting basic cells in a unit cell and the second kind for interconnection among unit cells, become long, and further the variety and the scale of the unit cell are limited by the number of the channels available in the space between adjacent basic cell arrays. As a wiring line becomes longer, the propagation delay of the signals in the circuit network of the masterslice semiconductor device increases because of the increase in the parasitic capacity of the wiring line. When such propagation delay becomes significant, the delay is usually compensated by providing a means such as a block-buffer circuit which has a high driving capability; however, a number of basic cells must be allotted for constituting the block-buffer circuit. For example, eleven of the basic cells, each having the configuration as shown in FIG. 2, are necessary for constituting one block-buffer circuit. Therefore, in a case wherein it is necessary to implement a number of block-buffer circuits, the basic cells available for constituting desired unit cells are decreased. As a result, the variety of circuits obtainable by use of the masterslice technology is also limited.

On the contrary, if it were possible to constitute a unit cell by extending beyond the space between the adjacent basic cell arrays, that is, if the unit cell were two-dimensional in terms of the arrangement of the basic cells, the problem of the propagation delay of the signals and other inconveniences which arise from the above-mentioned restriction in the prior art unit cell configuration could be eliminated, and the freedom in the circuit design of a masterslice semiconductor device could be substantially increased.

SUMMARY OF THE INVENTION

It is, therefore, the primary object of the present invention to provide a masterslice semiconductor device comprised of basic cells having a bulk pattern which permits unit cells to range over plural basic cell arrays.

It is another object of the present invention to provide a masterslice semiconductor device having a high propagation speed of signals.

The above objects are accomplished by constituting a masterslice semiconductor device which incorporates a second type of basic cell array into each space between two adjacent basic cell arrays of a first type, with each of the first and second types of the basic cell arrays comprising basic cells substantially as in the prior art masterslice semiconductor devices. Each of the second type of basic cell arrays is comprised of second basic cells having a relatively larger size and higher power capacity p-channel and/or n-channel transistors, when compared with the first basic cell arrays comprised of basic cells each having p-channel and/or n-channel transistors of relatively smaller size and lower driving capability. The second basic cells in each second basic cell array are arranged in parallel to the longitudinal direction of the first basic cell arrays, and wiring lines can be provided for interconnecting the unit cells in a single first basic cell array and/or in two adjacent first basic cell arrays. Further, the second basic cells in a second basic cell array can constitute a unit cell in conjunction with the first basic cells in any adjacent first basic cell arrays, if necessary.

In the CAD of a circuit network of the masterslice semiconductor device according to the present invention, the layout of the wiring lines to be laid over the space between the adjacent first basic cell arrays, in other words, over the second basic cell array, can be accomplished without particular modifications to the CAD system, while each of the unit cells can be two-dimensional in terms of the arrangement of basic cells as, for the case where the unit cell comprises at least one of the second basic cells. As a result, the number and the lengths of the wiring lines interconnecting the unit cells are decreased, and hence the propagation delay of signals can be maintained at a lower level, and the variety of unit cell constructions in the masterslice semiconductor device is increased.

Other and further objects, features and advantages of the present invention will appear more fully from the following description with respect to the attached drawings.

BRIEF DESCRIPTION OF THE DRAWINGS

Throughout the figures, the same reference numeral or character designates the same or corresponding parts.

DESCRIPTION OF PREFERRED EMBODIMENTS

Figure 1:
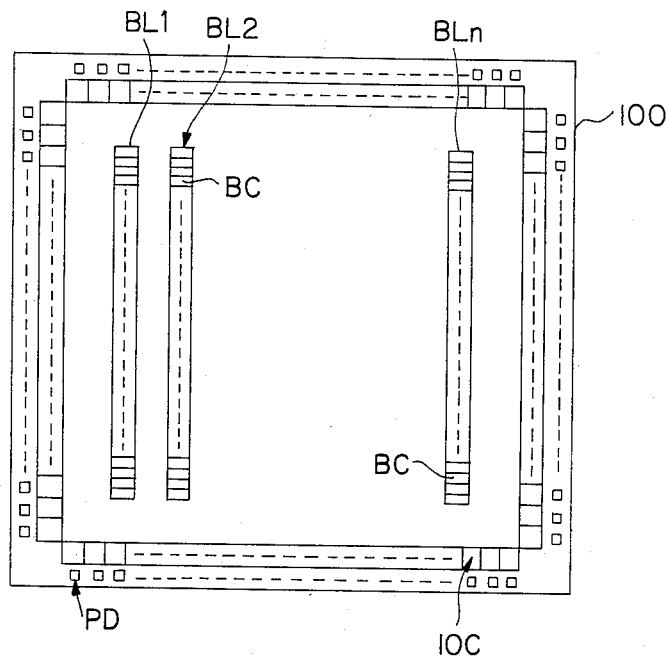
FIG. 1 is a plan view showing the conventional bulk pattern of a gate array LSI formed by use of the masterslice technology.
Figure 2:
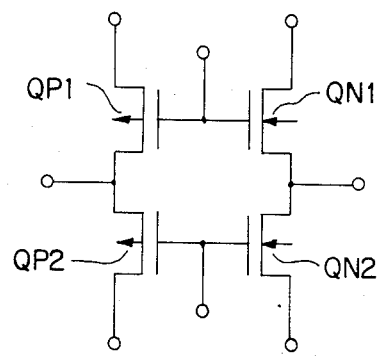
FIG. 2 is an equivalent circuit diagram of an exemplary basic cell BC shown in FIG. 1.
Figure 3:
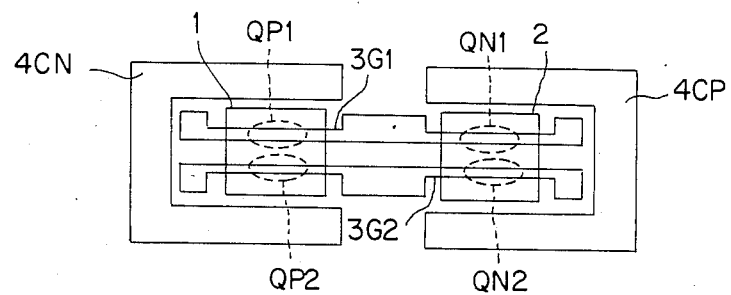
FIG. 3 is a plan view illustrating the bulk pattern of the basic cell embodying the circuit shown in FIG. 2.
Figure 4:
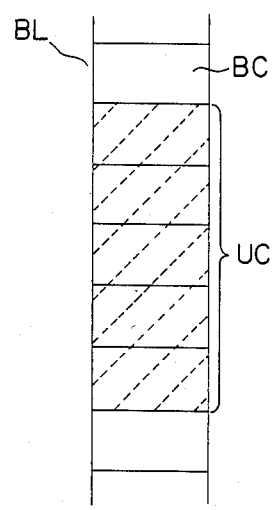
FIG. 4 is a conceptual diagram presenting the configuration of a unit cell.
Figure 5:
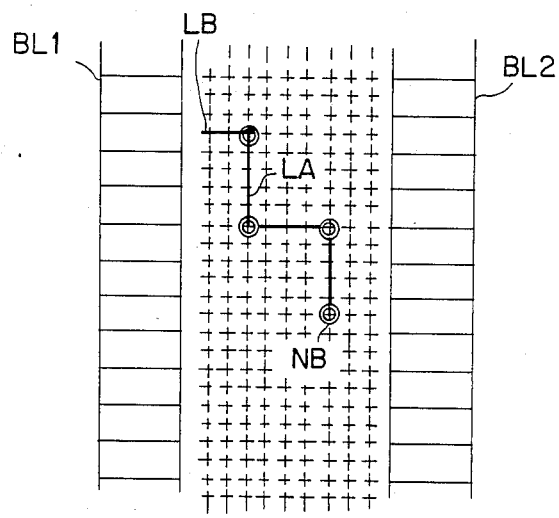
FIG. 5 is a plan view showing an exemplary layout of double-layer aluminum wiring lines on a virtual grid.
Figure 6A:
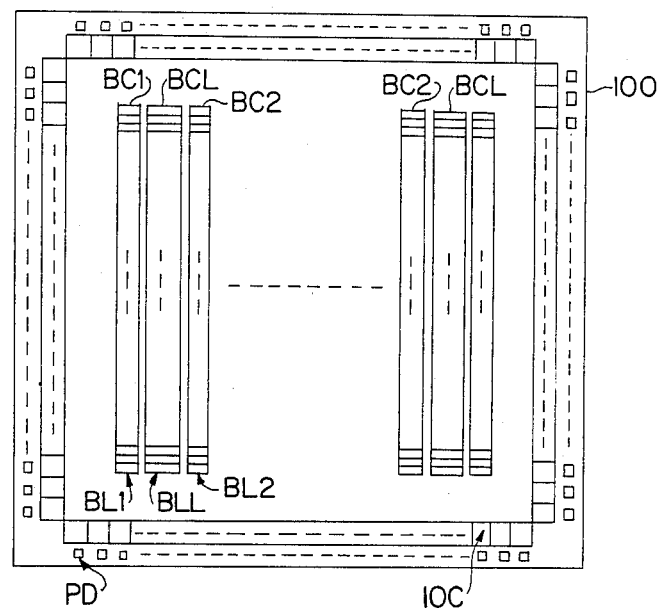
FIG. 6(a) is a plan view illustrating a bulk pattern of basic cell arrays according to the present invention.
Figure 6B:
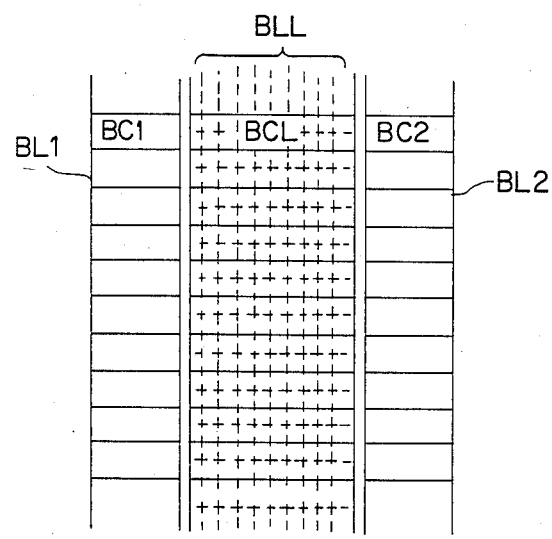
FIG. 6(b) is a partially enlarged plan view illustrating a bulk pattern of basic cell arrays shown in FIG. 6(a)

FIG. 6(a) is a plan view illustrating the essential layout of basic cell arrays in a masterslice semiconductor device according to the present invention, and FIG. 6(b) is a partially enlarged plan view illustrating a bulk pattern of basic cell arrays shown in FIG. 6(a). As seen in FIG. 6(a), a basic cell array BLL (which is referred to as the second basic cell array hereinafter) comprising a number of large sized basic cells, BCL, is formed between two basic cell arrays $BL_1$ and $BL_2$. The basic cell arrays $BL_1$ and $BL_2$ (which are referred to as the first basic cell arrays hereinafter) are respectively comprised of basic cells, $BC_1$, $BC_2$ each which has a size of substantially the same as that of the basic cells in the conventional masterslice semiconductor device. As shown in FIG. 6(b), a virtual grid wheel is the same as shown in FIG. 5 is defined in the region occupied by the second basic cell array BLL. That is, the wiring lines are distributed on the virtual grid lines as in the prior art masterslice semiconductor device.

Figure 7:
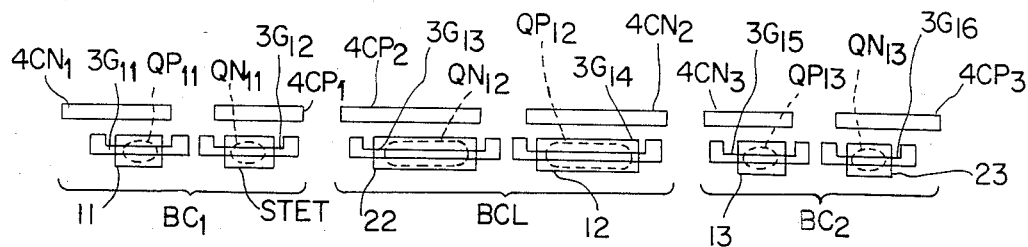
FIG. 7 is a plan view illustrating an exemplary bulk pattern of the basic cells according to the present invention.

FIG. 7 is a plan view illustrating an exemplary bulk pattern of the first and the second basic cells according to the present invention. As shown again in FIG. 7, the first basic cells $BC_1$ and $BC_2$ respectively belong to the first basic cell arrays $BL_1$ and $BL_2$, and the second basic cell BCL belongs to the second basic cell array BLL. The region occupied by the second basic cell array BLL is about the same as the space for the wiring lines interconnecting basic cells in the prior art masterslice semiconductor device. In FIG. 7, each of the reference numerals 11, 12 and 13 designates the respective p-type region of the p-channel transistors $QP_{11}$, $QP_{12}$ and $QP_{13}$, and each of the reference numerals 21, 22 and 23 designates the respective n-type region of the n-channel transistors $QN_{11}$, $QN_{12}$ and $QN_{13}$, and, further, each of the reference characters $4CP_1$, $4CP_2$ and $4CP_3$ designates a p-type contact region and each of the reference characters $4CN_1$, $4CN_2$ and $4CN_3$ designates a n-type contact region.

As shown by FIG. 7 the second basic cell BCL has the same structure as that of the first basic cell $BC_1$ or $BC_2$ in principle, except only for the difference in the dimension along the gate width. That is, the p-channel transistor $QP_{12}$ and the n-channel transistor $QN_{12}$ of the second basic cell BCL respectively have the gates $3G_{14}$ and $3G_{13}$ whose widths are larger compared with the respective gates $3G_{11}$ and $3G_{12}$ of the p-channel transistor $QP_{11}$ and n-channel transistor $QN_{11}$ of the first basic cell $BC_1$, and also larger compared with the respective gates $3G_{15}$ and $3G_{16}$ of the p-channel transistor $QP_{13}$ and n-channel transistor $QN_{13}$ of the other first basic cell $BC_2$. In the direction along the gate length, the transistors $QP_{12}$ and $QN_{12}$ have the same dimension as those of the transistors $QP_{11}$, $QN_{11}$, $QP_{13}$ and $QN_{13}$. The width ratio of the gates of the first basic cell and the second basic cell is, for example, 7:3.

Figure 8:
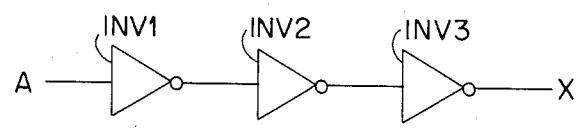
FIG. 8 is an equivalent circuit diagram showing an inverter circuit.

FIG. 8 is an equivalent circuit diagram showing an inverter circuit. The circuit is comprised of three serially connected inverters $INV_1$, $INV_2$ and $INV_3$, wherein A and X denote an input signal and an output signal, respectively. The inverter circuit shown in FIG. 8 is dealt with as a unit cell in the CAD system.

Figure 9:
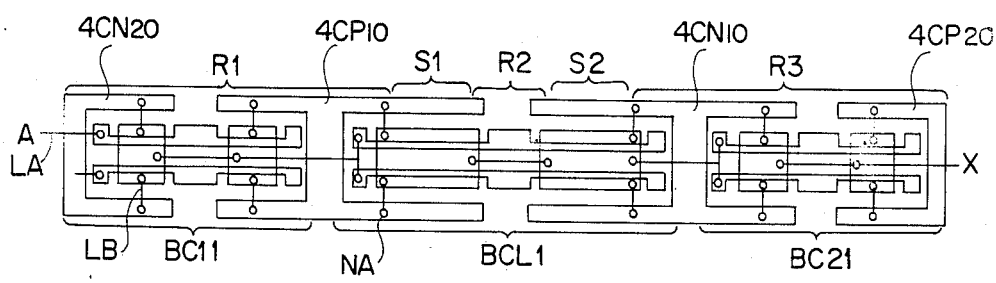
FIG. 9 is a plan view illustrating the essential portion of a bulk pattern embodying the inverter circuit shown in FIG. 8.

FIG. 9 is a plan view illustrating the essential portion of a bulk pattern embodying the inverter circuit, i.e. a unit cell, as shown in FIG. 8. Each of the basic cells $BC_{11}$, $BCL_1$ and $BC_{21}$ in FIG. 9 is respectively comprised of a pair of the basic cells $BC_1$, BCL and $BC_2$ in FIG. 7. In each of the basic cells $BC_{11}$, $BCL_1$ and $BC_{21}$, the gates of each pair of p-channel transistors and n-channel transistors form a common gate. Also, in each of the basic cells $BC_1$, BCL and $BC_2$, the sources or drains of each pair of the p-channel transistors occupy a single p-type region and the sources or drains of each couple of n-channel transistors occupy a single n-type region. The adjacent two or four contact regions of same type are united together into each single contact region $4CP_{10}$, $4CN_{10}$, $4CP_{20}$ or $4CN_{20}$. In FIG. 9, NA indicates each of the contact portions (marked with circles) of the aforesaid first aluminum layer wiring lines, LA, and the second aluminum layer wiring lines, LB, to the semiconductor substrate. As shown in FIG. 9, there are two kinds of regions along the row of the basic cells $BC_1$, BCL and $BC_2$; that is, the one where the aluminum wiring lines LA and LB are distributed, and the other where any aluminum wiring line does not exist. In FIG. 9, the former regions are indicated by $R_1$, $R_2$ and $R_3$, while the latter regions are indicated by $S_1$ and $S_2$.

Figure 10:
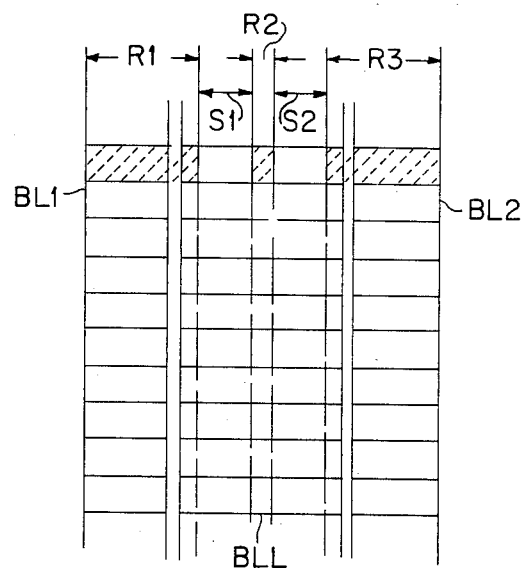
FIGS. 10 and 11 are plan views of a bulk pattern, both for indicating the regions for the aluminum wiring.

FIG. 10 is a plan view illustrating the position of a unit cell as shown by FIG. 9 in a bulk pattern which is the same as in FIG. 6(b). In FIG. 10, the hatched regions $R_1$, $R_2$ and $R_3$ are assigned to the aluminum layer wiring lines LA and LB distributed within the unit cell. The regions $S_1$ and $S_2$ throughout the bulk pattern can be used for distributing the aluminum layer wiring lines interconnecting unit cells. As is obviously seen in FIG. 10, a unit cell can be comprised of basic cells in the basic cell arrays $BL_1$, BLL and/or $BL_2$. That is, the unit cell can be two-dimensional in terms of the arrangement of the basic cells. This is because the large-sized basic cell in the basic cell array BLL is capable of functionally interconnecting the basic cell arrays $BL_1$ and $BL_2$, and is also able to serve as the region for distributing the wiring lines interconnecting unit cells. Such features cannot be provided by the basic cell in the prior art masterslice semiconductor device.

The number of channels of the wiring lines to be distributed in the regions $S_1$ and $S_2$ is, of course, decreased into, for example, 70 per cent of the channels in the prior art masterslice semiconductor device, in so far as the width of the basic cell array BLL is the same as that of the space between the adjacent basic cell arrays in the prior art. On the other hand, with the introduction of the two-dimensional unit cell, the number of the wiring lines necessary for interconnecting unit cells are comparably reduced. This means that, in the masterslice semiconductor device of the present invention, no particular modifications are needed for designing the first basic cell arrays, $BL_1$, $BL_2$, ... $BL_n$, i.e. the width and the pitch in the arrangement of the first basic cell arrays can be the same as those in the prior art. If the full number of channels, for instance, is required to be accommodated within a range along a few basic cells of the second basic cell array, the entire region occupied by the relevant basic cells may be used for the wiring lines of the required channels, and the basic cells are made ineffective instead.

Figure 11:
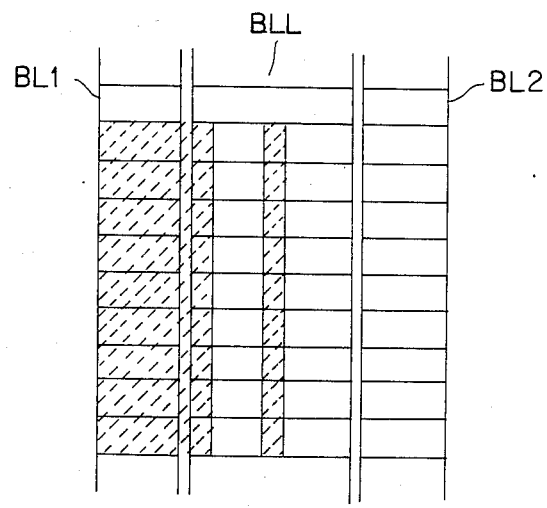

FIG. 11 is a plan view illustrating a bulk pattern which is the same as that in FIG. 10. FIG. 11 represents the case wherein only the transistors arranged in a half column of the basic cell array BLL are utilized to constitute unit cells in conjunction with the basic cells in basic cell array $BL_1$. Therefore, the remainder half portion of the basic cell array BLL is exclusively used for the the wiring interconnecting unit cells. In the FIG. 11, the hatched area is the region allotted for the unit cells. This bulk pattern configuration is useful in the case where the required channel number for the wiring lines is substantially large.

Figure 12:
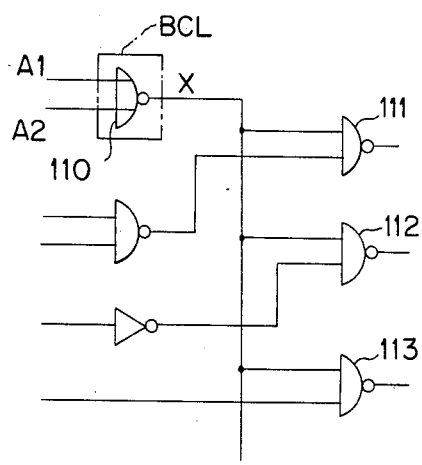
FIG. 12 is a circuit diagram including a 2-input NOR gate attached with heavy output load.

FIG. 12 is a circuit diagram including a 2-input NOR gate burdened with a heavy output load. In FIG. 12, $A_1$ and $A_2$ denote two input signals, and BCL indicates a basic cell constituting the 2-input NOR gate. The 2-input NOR gate 110 is attached with three 2-input NAND gates 111, 112 and 113 to its output. When each of the gates is comprised of a unit cell in a masterslice semiconductor device, the output of the 2-input NOR gate 110 is attached with a large parasitic capacity due to the long wiring lines interconnecting these gates. As a result, the propagation delay of the signal $A_1$ and $A_2$ becomes significant in the prior art masterslice technology. As a result, a block-buffer circuit is used to be provided for the output of the NOR gate 110. On the other hand, in the present invention, the large-sized basic cell in the basic cell array BLL can provide a 2-input NOR gate having high driving power, thereby eliminating the need for the block-buffer circuit.

Figure 13:
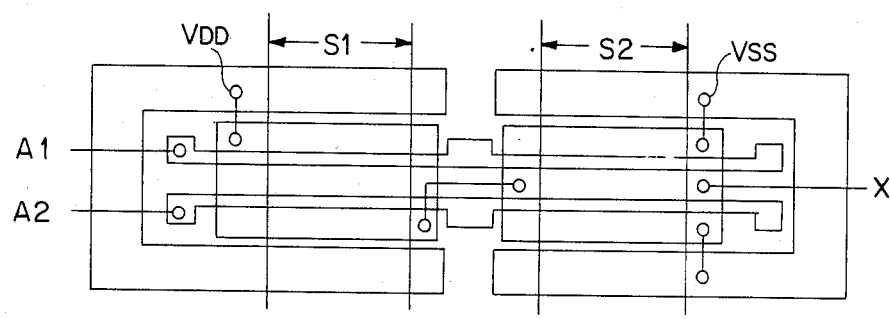
FIG. 13 is a plan view of an exemplary bulk pattern of the large sized basic cell, embodying the 2-input NOR gate in the circuit shown in FIG. 12.

FIG. 13 is a plan view of a bulk pattern of the large-sized basic cell, embodying the 2-input NOR gate 110 in the circuit shown in FIG. 12. In FIG. 13, $V_{DD}$ and $V_{SS}$ denote the levels of the positive potential source and the negative potential source, respectively, and $S_1$ and $S_2$ denote the region to be used as wiring regions, as explained above with reference to FIG. 10.

In the masterslice semiconductor device according to the present invention, the integration density of the transistors on a semiconductor chip is increased thanks to the increment of transistors in the regions which are, in the prior art, exclusively used for distributing interconnecting lines. Further, the two dimensional arrangement of basic cells in a unit cell increases the availability of transistors for constituting a circuit network of a masterslice semiconductor device, and increases the freedom in the design of the circuit networks. Thus, the variety of the LSI semiconductor network fabricated by use of masterslice technology can be increased.

The many features and advantages of the present invention are apparent from the detailed description, but it will be recognized by those skilled in the art that many further modifications and variations may be affected within the spirit and scope of the present invention. For example, in the masterslice semiconductor device of the present invention, the entire region occupied by any of the basic cell arrays comprised of the large-sized basic cells can be used exclusively as the wiring region, as in the prior art, or, on the contrary, a unit cell can be comprised of only the basic cells in the region. Furthermore, the arrangement of p-channel and n-channel transistors along a row may be optional among the basic cell arrays, provided that regularity of the arrangement is kept within each basic cell array. For instance, in a basic cell array, all of the p-channel transistors occupy the left-hand-side positions against n-channel transistor, while in any of other basic cell arrays, vice versa.

I claim:

1. A masterslice semiconductor device comprising a substrate,
pluralities of first and second arrays of respective first and second basic cells on said substrate, each said array including a column of the respective basic cells aligned along a first direction, each said second array being located between respective ones of said first arrays, and each said basic cell of said second array having a higher current capacity than the basic cells of said first arrays, and
first wiring for defining unit cells including connections extending transversely to said first direction to connect between basic cells of each said first array and of at least one of a respective adjacent one of said second arrays and a respective other one of said first arrays, and
second wiring for respectively connecting together said unit cells to define an integrated circuit, including connections extending over said second arrays in said first direction.

2. The device of claim 1, wherein pluralities of first and second column areas are defined, each extending in said first column direction, said column areas including at least a plurality of said first arrays and a part of each said second array, said first wiring being limited to said first column areas, and said second column areas including a part of each said second arrays, said second wiring being limited to said second column areas.

3. The device of claim 2, wherein said basic cells of said arrays are arranged to define rows extending transversely to said first direction, each said basic cell comprises at least one respective MIS (metal-insulator-semiconductor) transistor, each said MIS transistor has a respective gate electrode extending along the respective row to define a respective channel, the gate and channel widths of the transistors of the first basic cells are shorter in the direction along the row than the widths of the transistors of the second basic cells, and said second wiring includes wiring extending across said channels of at least some of said transistors of said basic cells of said second arrays.

4. The device of claim 3, wherein said first column areas include at least all of alternating ones of said first arrays and a part of each adjoining second array, and there is a plurality of said second column areas for each said second array.

5. The device of claim 4, wherein each said first column area includes a respective part of each adjoining second array located adjacent to the respective first array.

6. The device of claim 1, 2, 3, 4 or 5, said first wiring including connections between at least one of the basic cells of at least one of said first arrays and of both of said adjacent second array and at least one other of said first arrays, and further connections extending in said first direction for connecting between adjacent basic cells within the same respective array, wherein said first wiring provides at least respective ones of said unit cells with two-dimensional wiring.

7. The device of claim 6, each said basic cell comprising a pair of said MIS transistors, each said pair including a p-channel transistor and an n-channel transistor, wherein the gates of said transistors along each said row extend in parallel with each other.

8. The device of claim 7, wherein said pair of transistors of each said basic cell have a single common gate.

9. The device of claim 8, each said basic cell of at least one of the first and second arrays comprising a further pair of said transistors, wherein a single p-type semiconductor region of each said basic cell of the respective first and second arrays commonly provides, a respective different one of the source and drain of the p-channel transistors, and a single n-type semiconductor region of each said basic cell of the respective first and second arrays commonly provides a respective different one of the source and drain of the n-channel transistors.

10. A masterslice semiconductor device comprising a substrate, pluralities of first and second arrays of respective first and second basic cells on said substrate, each said array including a column of the respective basic cells aligned along a first direction, each said second array being located between respective ones of said first arrays, and each said basic cell of said second array having a higher current capacity than the basic cells of said first arrays, and first wiring for defining unit cells, including connections extending in said first direction between adjacent basic cells of the same respective first array, second wiring for connecting together said unit cells to define an integrated circuit, including connections extending over said second arrays in said first direction.

11. The device of claim 10, wherein first and second column areas are defined, each extending in said first direction, said first column areas including at least a plurality of said first arrays and a part of each said second array, said first wiring being limited to said first column areas, and a plurality of second column areas including a further part of each said second array, said second wiring being limited to said second column areas.

12. The device of claim 11, wherein said basic cells of said arrays are arranged to define rows extending transversely to said first direction, each said basic cell comprises at least one respective MIS (metal-insulator-semiconductor) transistor, each said MIS transistor has a respective gate electrode extending along the respective row to define a respective channel, the gate and channel widths of the transistors of the first basic cells are shorter in the direction along the row than those of the transistors of the second basic cells, and said second wiring includes wiring extending across said channels of at least some of said transistors of said basic cells of said second arrays.

13. The device of claim 12, wherein said first column areas include at least all of alternating ones of said first arrays, and there is a plurality of said second column areas for each said second array.

14. The device of claim 13, wherein each said first column area includes a respective part of each adjoining second arrays located adjacent to the respective first array.

15. The device of claim 14, each said cell comprising a pair of said MIS transistors, each said pair including a p-channel transistor and an n-channel transistor, wherein the gates of said transistors along each said row extend in parallel with each other.

16. The device of claim 15, wherein said pair of transistors of each said basic cell have a single common gate.

17. The device of claim 16, each said basic cell of at least one of the first and second arrays comprising a further pair of said transistors, wherein a single p-type semiconductor region of each said basic cell of the respective first and second array provides a respective different one of the source and drain of the p-channel transistors, and a single n-type semiconductor region of each said basic cell of the respective first and second arrays provides a respective different one of the source and drain of the n-channel transistors.

* * * * *

UNITED STATES PATENT AND TRADEMARK OFFICE
CERTIFICATE OF CORRECTION

PATENT NO. : 4,611,236

DATED : 9 September 1986

INVENTOR(S) : SHINJI SATO

It is certified that error appears in the above-identified patent and that said Letters Patent is hereby corrected as shown below:

Front Page, [57] ABSTRACT, line 3, delete "same".

Col. 1, line 25, "$B_n$" should be --$BL_n$--.

Col. 2, line 57, delete "each".

Col. 4, line 19, "cells as," should be --cells, as--.

Col. 5, line 15, after "each" insert --of--;
        line 15, "size of" should be --size--;
        line 18, "wheel" should be --which--.

Col. 7, line 1, "the the wiring" should be --wiring the--;
        line 41, "network" should be --networks--.

Signed and Sealed this

Twenty-third Day of December, 1986

*Attest:*

DONALD J. QUIGG

*Attesting Officer*   *Commissioner of Patents and Trademarks*